METHOD OF MANUFACTURING SEMICONDUCTOR DEVICES

Filed Sept. 28, 1964

INVENTORS
ERIC F. CAVE &
ARTHUR E. ROSWELL
BY W. S. Hill
AGENT 3,333,324
Patented Aug. 1, 1967

3,333,324

METHOD OF MANUFACTURING SEMICONDUCTOR DEVICES

Arthur E. Roswell and Eric F. Cave, Somerville, N.J., assignors to Radio Corporation of America, a corporation of Delaware Filed Sept. 28, 1964, Ser. No. 399,479
3 Claims. (Cl. 29—497.5)

ABSTRACT OF THE DISCLOSURE

A method of bonding two semiconductor bodies to each other by (1) applying a metal layer of chromium, cobalt, iron, manganese, nickel, niobium, rhenium, rhodium, tantalum, titanium, zirconium, or alloys thereof to a surface of at least one of the semiconductor bodies, (2) disposing the other semicondustor body against the metal layer, and (3) pressing the semiconductor bodies together with a pressure of between 200 p.s.i. and 5,000 p.s.i., while heating the semiconductor bodies and the metal layer at a temperature of between 1050° C. and 1400° C. for a duration of between ½ and 60 minutes to form a solid diffusion of the metal layer and semiconductor bodies.

This invention relates generally to a method of manufacturing semiconductor devices, and more particularly to an improved method of making a bond by the solid diffusion of an intermediate layer of metal disposed between semiconductor materials. The improved method of the present invention is particularly useful for bonding together semiconductor wafers of the type employed in electronic integrated circuits.

In the manufacture of certain integrated circuits, relatively thin wafers of semiconductor material are employed. Since these wafers are usually fragile and small, it is desirable to attach them to relatively larger substrates, preferably having the same coefficient of expansion as the wafers, to provide suitable means for the wafer during the manufacturing process. It is also desirable, in many instances, that the wafer be electrically as well as physically connected to the substrate so that the substrate or a metallic interface between the wafer and the substrate may serve as a common electrical connection for certain components of the integrated circuits to be formed on the wafer. A suitable substrate for an integrated circuit wafer may therefore comprise another body of the same semiconductor material as that of the circuit wafer.

It is an object of the present invention to provide an improved method of bonding two semiconductor materials together with an electrically conductive interface.

Another object of the present invention is to provide an improved method of bonding a monocrystalline wafer of semiconductor material to a semiconductor substrate by a solid diffusion of a bonding material that comprises a metal which can serve as a common connection for an integrated circuit to be formed on the wafer.

Still another object of the present invention is to provide an improved method of the type described that is relatively simple to carry out and which produces solid diffusion bonds of good quality.

The improved method of the present invention is particularly applicable to bonding together semiconductor materials, such as germanium and silicon, that have substantially flat surfaces. Briefly stated, two wafers of silicon, for example, can be bonded together by a solid diffusion bond, in accordance with the present invention, by first applying a layer of a selected metal or alloy to a flat surface of at least one of the wafers. The metallized wafer is then disposed against a flat surface of the other wafer, hereinafter called the substrate, with the metallic layer against the flat surface of the substrate. Controlled heat and pressure are applied to the assembly of the metallized wafer and the substrate until a solid diffusion bond is formed. The temperature of the assembly should be about 85% of the absolute temperature (° K.) of the melting point of that component of the assembly which has the lowest melting point at the pressure applied. The upper limit of temperature is just below the melting point of the component of the assembly with the lowest melting point and below the melting point of any alloy formed by the metal and the semiconductor material. The heating and pressing operations are carried out preferably in a neutral or reducing ambient.

The novel features of the present invention, both as to its organization and operation, as well as additional objects and advantages thereof, will be more readily understood from the following description, when read in connection with the accompanying drawing, in which similar reference characters represent similar parts throughout, and in which.

Figure 1:
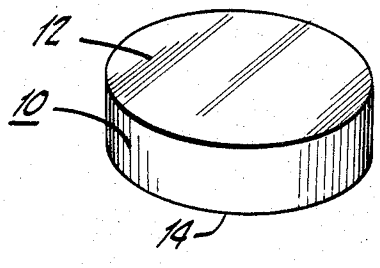
FIG. 1 is a perspective view of a wafer of semiconductor material used in the improved method of the present invention.

Referring, now, particularly to FIG. 1 of the drawing, there is shown a wafer 10 of semiconductor material, such as monocrystalline germanium or silicon, for example, on which it is desired to produce an integrated circuit. The wafer 10 has two opposed major surfaces 12 and 14. The shape of the wafer 10 may be round, as illustrated in FIG. 1, or of any other desired shape. The thickness of wafer 10 may be of the order of the 10 mils initially, for example.

Figure 2:
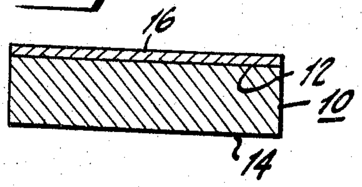
FIG. 2 is a front elevational, cross-sectional view of the wafer of semiconductor material illustrated in FIG. 1, showing a step in the method of the present invention.

In some integrated circuits, it may be desired that the wafer 10 be lapped to a thickness of a few microns. Since such a thin wafer would be extremely fragile and difficult to manipulate, it is desirable to bond the wafer 10 to a relatively thicker and more rigid substrate whose coefficient of expansion is substantially the same as that of the wafer 10. To this end, a layer 16 of a metal or an alloy of metals from the group consisting of chromium, cobalt, iron, manganese, nickel, niobium, rhenium, rhodium, tantalum, titanium, and zirconium is applied to one of the major flat surfaces, such as the surface 12, of the wafer 10, as shown in FIG. 2. The metallic layer 16 may be applied to the surface 12 either by plating, or by vaporizing the metal onto the surface 12 in an evacuated ambient, or by dipping the wafer in a finely divided powder of the metal, or by disposing a thin foil of the metal or alloy on the surface 12. The thickness of the layer 16 may be between about 1,000 and 100,000 A., for example.

The metal of the layer 16 should have the following properties for any particular application:

(1) It should have a melting point higher than the temperature required to process the assembly comprising the wafer 10.

(2) It should not form an alloy with the semiconductor material that melts at a temperature lower than the temperature required to process the assembly.

(3) It should either exhibit solubility in the semiconductor material or the semiconductor material should exhibit solubility in it.

Figure 3:
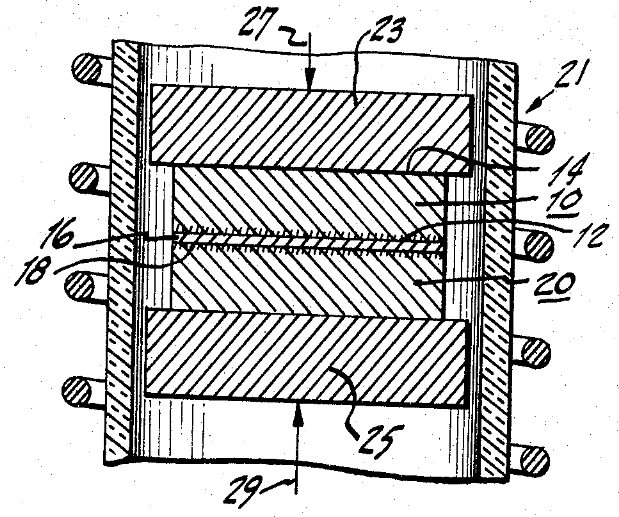
FIG. 3 is a cross-sectional view of two wafers under pressure in an induction heating furnace in an operation of the improved method of the present invention.

Since the coefficient of expansion of a substrate to which the wafer 10 is to be joined should be substantially the same as that of the wafer 10, the substrate should be preferably, although not necessarily, of the same material as the wafer 10. However, the substrate need not be a monocrystalline semiconductor, but may be polycrystalline and/or degenerate semiconductor material if it is also to function as an electrical connector. Thus, referring to FIG. 3 of the drawing, there is shown an assembly of the wafer 10 with its metallic layer 16 disposed against a major flat surface 18 of a substrate 20. The substrate 20 is of the same semiconductor material as the wafer 10, though the former may be of different conductivity type from the latter.

A solid diffusion bond can be formed between the metallic layer 16 and the semiconductor material of both the wafer 10 and the substrate 20 by heating the superimposed assembly in an induction furnace 21 while the assembly is under pressure. To this end, the assembly of the metallized wafer 10 and the substrate 20 is disposed between carbon blocks 23 and 25 and pressure is applied between the wafer 10 and the substrate 20 in the directions indicated by the arrows 27 and 29.

The temperature to which the assembly of the metallized wafer 10 and the substrate 20 is heated should be at least about 85% of the absolute temperature of the melting point, but below the melting point, of any of the components of the assembly or of any eutectic that may be formed by the assembly, at the pressure applied between the wafer 10 and the substrate 20. For example, where the metallic layer 16 is of chromium or titanium and the wafer 10 and the substrate 20 are of silicon, the temperature of the induction furnace 21 can be between 1050° C. (1323° K.) and 1400° C. (1673° K.), and the pressure may be between about 200 and 5000 p.s.i. This operation should be carried out in a vacuum or in a neutral or reducing ambient, should as argon or hydrogen, for example. The aforementioned heat and pressure may be applied for a period ranging from ½ minute to one hour until a solid diffusion between the metal layer 16 and the semiconductor material of the wafer 10 and the substrate 20 has taken place, thereby bonding the wafer 10 to the substrate 20.

Figure 4:
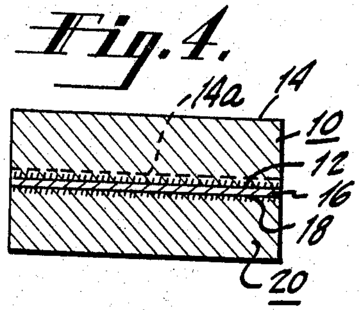
FIG. 4 is a front elevational, cross-sectional view of a wafer bonded to a substrate in accordance with the present invention, the dashed line representing a plane to which the wafer is to be lapped or polished.
Figure 5:
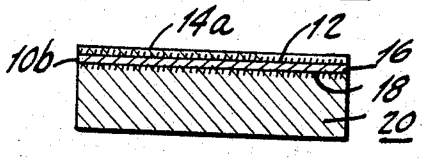
FIG. 5 is a front elevational, cross-sectional view of a lapped, relatively thin wafer bonded to a substrate in accordance with the present invention.

After the wafer 10 has been bonded to the substrate 20, the surface 14 of the wafer 10 may be lapped to give the wafer 10 any desired thickness. If, for example, the surface 14 of the wafer 10 is lapped to the plane indicated by the dashed line 14*a*, in FIG. 4, the wafer 10 is converted to a wafer 10*b*, as shown in FIG. 5. By being bonded to the substrate 20, the lapping process is rendered feasible.

Instead of coating only one of the abutting surfaces of the two semiconductor materials to be bonded by the aforementioned method, it is preferable to coat each of the abutting surfaces with a metallic layer.

It will be seen, referring to FIG. 5, that the relatively thin and fragile wafer 10*b* is now bonded to a thicker, more rigid substrate 20 by means of a metallic interface, the layer 16, which includes portions diffused into the semiconductor wafer 10*b* and the substrate 20. The layer 16, in the assembly shown in FIG. 5, may now function as a common connection for components of the circuitry (not shown) that may be disposed on or in the wafer 10*b*. Also, if the semiconductor material of the substrate 20 is degenerate, the substrate 20 may function, together with the metallic layer 16, as an electrical shield and a common connection for any circuitry associated with the wafer 10*b*.

From the foregoing description, it will be apparent that there has been provided an improved method of bonding two objects of semiconductor material together by solid diffusion bonds. While only a few examples of the improved method have been described, variations in the steps of the present invention, all coming within the spirit of this invention, will, no doubt, readily subject themselves to those skilled in the art. Hence, it is desired that the foregoing description shall be considered as illustrative and not in a limiting sense.

What is claimed is:

1. In a method of manufacturing a semiconductor device comprising two parts of silicon each having a substantially flat surface, said method comprising the steps of applying a layer of a metal chosen from the group consisting of chromium, cobalt, iron, manganese, nickel, niobium, rhenium, rhodium, tantalum, titanium, zirconium, and alloys thereof to said flat surface of at least one of said parts, stacking said parts with said layer between them, heating said stacked parts and said layer to a temperature between about 1050° C. and 1400° C., and applying pressure between said stacked parts of between 200 p.s.i. and 5,000 p.s.i. during said heating, said heating and said application of pressure being for a duration of between ½ and 60 minutes, whereby to form a solid diffusion of said layer and said semiconductor materials.

2. In a method of manufacturing a semiconductor device comprising two parts of silicon each having a substantially flat surface, said method comprising the steps of applying a layer of chromium, to said flat surface of at least one of said parts, stacking said parts with said layer between them, heating said stacked parts and said layer to a temperature between about 1050° C. and 1400° C., and applying pressure between said materials of between about 200 and 5,000 p.s.i. during said heating, said heating and said application of pressure being for a duration of between about ½ and 60 minutes, whereby to form a solid diffusion of said layer and said materials.

3. In a method of manufacturing a semiconductor device comprising two parts of silicon each having a substantially flat surface, said method comprising the steps of applying a layer of titanium to said flat surface of at least one of said parts, stacking said parts with said layer between them, heating said stacked parts and said layer to a temperature between about 1050° C. and 1400° C., and applying pressure between said material of between about 200 and 5,000 p.s.i. during said heating, said heating and said application of pressure being for a duration of between about ½ and 60 minutes, whereby to form a solid diffusion of said layer and said materials.

References Cited

UNITED STATES PATENTS

| | | | |
|---|---|---|---|
| 2,701,326 | 2/1955 | Pfann et al. | 148—1.5 X |
| 2,743,201 | 4/1956 | Johnson et al. | |
| 2,793,145 | 5/1957 | Clark | 29—25.3 X |
| 2,897,419 | 7/1959 | Howland et al. | |
| 2,945,285 | 7/1960 | Jarobs. | |
| 3,121,829 | 2/1964 | Huizing et al. | 29—25.3 X |
| 3,201,235 | 8/1965 | Mueller et al. | 148—1.5 X |
| 3,205,101 | 9/1965 | Mlavsky et al. | 148—1.5 X |

JOHN F. CAMPBELL, *Primary Examiner.*

L. J. WESTFALL, *Assistant Examiner.*